United States Patent
Karpov et al.

(10) Patent No.: US 8,877,657 B2
(45) Date of Patent: Nov. 4, 2014

(54) PROCESS FOR PRODUCING SEMICONDUCTIVE LAYERS

(75) Inventors: Andrey Karpov, Mannheim (DE); Friederike Fleischhaker, Niedernhausen (DE); Imme Domke, Mannheim (DE); Marcel Kastler, Mainz (DE); Veronika Wloka, Mannheim (DE); Lothar Weber, Bielefeld (DE)

(73) Assignee: BASF SE, Ludwigshafen (DE)

( * ) Notice: Subject to any disclaimer, the term of this patent is extended or adjusted under 35 U.S.C. 154(b) by 224 days.

(21) Appl. No.: 13/266,935

(22) PCT Filed: Apr. 26, 2010

(86) PCT No.: PCT/EP2010/055499
§ 371 (c)(1),
(2), (4) Date: Oct. 28, 2011

(87) PCT Pub. No.: WO2010/125011
PCT Pub. Date: Nov. 4, 2010

(65) Prior Publication Data
US 2012/0043537 A1    Feb. 23, 2012

(30) Foreign Application Priority Data
Apr. 28, 2009    (EP) .................................... 09158896

(51) Int. Cl.
*H01L 21/31*    (2006.01)
*H01L 29/786*   (2006.01)
*C23C 18/12*    (2006.01)
*H01L 21/02*    (2006.01)
*H01L 29/66*    (2006.01)

(52) U.S. Cl.
CPC ........ *C23C 18/1216* (2013.01); *H01L 29/7869* (2013.01); *C23C 18/1245* (2013.01); *H01L 21/02488* (2013.01); *H01L 29/66742* (2013.01); *H01L 21/02628* (2013.01); *H01L 21/02381* (2013.01); *H01L 21/02565* (2013.01); *H01L 21/02554* (2013.01)
USPC .................................. 438/781; 257/E21.078

(58) Field of Classification Search
USPC ............ 257/43, E21.078, E29.094; 438/104, 438/780, 781
See application file for complete search history.

(56) References Cited

U.S. PATENT DOCUMENTS 7,906,415 B2 *  3/2011  Li et al. ......................... 438/488
2002/0100696 A1 *  8/2002  Sano et al. .................... 205/333

(Continued)

FOREIGN PATENT DOCUMENTS

| EP | 1 993 122 | 11/2008 |
|----|-----------|---------|
| JP | 2004 149367 | 5/2004 |

(Continued)

OTHER PUBLICATIONS

Schneider, J. J., et al., "A Printed and Flexible Field-Effect Transistor Device with Nanoscale Zinc Oxide as Active Semiconductor Material," Advanced Materials, vol. 20, No. 18, pp. 3383-3387, (Sep. 17, 2008) XP002617672.

(Continued)

*Primary Examiner* — Chandra Chaudhari
(74) *Attorney, Agent, or Firm* — Oblon, Spivak, McClelland, Maier & Neustadt, L.L.P.

(57) ABSTRACT

The present invention relates to a process for producing a layer comprising at least one semiconductive metal oxide on a substrate, comprising at least the steps of:
(A) preparing a solution comprising at least one precursor compound of the at least one metal oxide selected from the group consisting of carboxylates of mono-, di- or polycarboxylic acids having at least three carbon atoms, or derivatives of mono-, di- or polycarboxylic acids, alkoxides, hydroxides, semicarbazides, carbamates, hydroxamates, isocyanates, amidines, amidrazones, urea derivatives, hydroxylamines, oximes, urethanes, ammonia, amines, phosphines, ammonium compounds, azides of the corresponding metal and mixtures thereof, in at least one solvent, (B) applying the solution from step (A) to the substrate and (C) thermally treating the substrate from step (B) at a temperature of 20 to 200° C., in order to convert the at least one precursor compound to at least one semiconductive metal oxide, where, if electrically neutral $[(OH)_x(NH_3)_yZn]_z$ where x, y and z are each independently 0.01 to 10 is used as the precursor compound in step (A), it is obtained by reacting zinc oxide or zinc hydroxide with ammonia, to a substrate which has been coated with at least one semiconductive metal oxide and is obtainable by this process, to the use of this substrate in electronic components, and to a process for preparing electrically neutral $[(OH)_x(NH_3)_yZn]_z$ where x, y and z are each independently 0.01 to 10, by reacting zinc oxide and/or zinc hydroxide with ammonia.

16 Claims, 1 Drawing Sheet

(56) References Cited

U.S. PATENT DOCUMENTS

| | | | |
|---|---|---|---|
| 2003/0150815 A1* | 8/2003 | Martin | 210/670 |
| 2004/0253438 A1* | 12/2004 | Budaragin et al. | 428/336 |
| 2005/0043184 A1* | 2/2005 | McCleskey et al. | 505/100 |
| 2006/0284171 A1* | 12/2006 | Levy et al. | 257/43 |
| 2007/0287221 A1* | 12/2007 | Ong et al. | 438/104 |
| 2008/0057631 A1 | 3/2008 | Cheng et al. | |
| 2008/0246095 A1* | 10/2008 | Wu et al. | 257/401 |
| 2008/0286907 A1 | 11/2008 | Li et al. | |
| 2010/0044696 A1* | 2/2010 | Cheng et al. | 257/40 |
| 2010/0120197 A1 | 5/2010 | Levy et al. | |
| 2010/0181564 A1 | 7/2010 | Kuegler et al. | |
| 2010/0283047 A1 | 11/2010 | Facchetti et al. | |
| 2010/0319778 A1 | 12/2010 | Kastler et al. | |
| 2010/0326527 A1 | 12/2010 | Facchetti et al. | |
| 2011/0101329 A1 | 5/2011 | Kastler et al. | |
| 2011/0120558 A1 | 5/2011 | Facchetti et al. | |
| 2011/0136333 A1 | 6/2011 | Facchetti et al. | |
| 2011/0136973 A1 | 6/2011 | Kastler et al. | |
| 2011/0155248 A1 | 6/2011 | Kastler et al. | |
| 2011/0168264 A1 | 7/2011 | Kastler et al. | |

FOREIGN PATENT DOCUMENTS

| | | |
|---|---|---|
| WO | 2006 138071 | 12/2006 |
| WO | 2009 010142 | 1/2009 |
| WO | WO 2009/013291 A2 | 1/2009 |
| WO | WO 2009/016107 A1 | 2/2009 |

OTHER PUBLICATIONS

Meyers, S. T., et al., "Aqueous Inorganic Inks for Low-Temperature Fabrication of ZnO TFTs," Journal of the American Chemical Society, vol. 130, No. 51, pp. 17603-17609, (Dec. 24, 2008) XP002617673.

International Search Report Issued Feb. 1, 2011 in PCT/EP10/055499 Filed Apr. 26, 2010.

U.S. Appl. No. 13/117,799, filed May 27, 2011, Michailovski, et al.
U.S. Appl. No. 13/379,247, filed Dec. 19, 2011, Riggs, et al.
U.S. Appl. No. 61/188,744, filed Aug. 11, 2008, Kastler, et al.
U.S. Appl. No. 61/088,215, filed Aug. 12, 2008, Facchetti, et al.
U.S. Appl. No. 61/088,236, filed Aug. 12, 2008, Facchetti, et al.
U.S. Appl. No. 13/140,595, filed Jun. 17, 2011, Mishra, et al.
U.S. Appl. No. 13/378,765, filed Dec. 16, 2011, Fleischhaker, et al.
U.S. Appl. No. 13/809,496, filed Jan. 10, 2013, Koehler, et al.

* cited by examiner

PROCESS FOR PRODUCING SEMICONDUCTIVE LAYERS

CROSS REFERENCE TO RELATED APPLICATIONS

The present application is a 35 U.S.C. §371 national stage patent application of International patent application PCT/EP2010/055499, filed on Apr. 26, 2010, published as WO/2010/125011 on Nov. 4, 2010, the text of which is incorporated by reference, and claims the benefit of the filing date of European application no. 09158896.2, filed on Apr. 28, 2009, the text of which is also incorporated by reference.

BRIEF SUMMARY OF THE INVENTION

The present invention relates to a process for producing a layer comprising at least one semiconductive metal oxide on a substrate, comprising at least the steps of (A) preparing a solution comprising at least one precursor compound of the at least one metal oxide selected from the group consisting of carboxylates of mono-, di- or polycarboxylic acids having at least three carbon atoms, or derivatives of mono-, di- or polycarboxylic acids, alkoxides, hydroxides, semicarbazides, carbamates, hydroxamates, isocyanates, amidines, amidrazones, urea derivatives, hydroxylamines, oximes, urethanes, ammonia, amines, phosphines, ammonium compounds, azides, inorganic complexes of the corresponding metal and mixtures thereof, in at least one solvent, (B) applying the solution from step (A) to the substrate and (C) thermally treating the substrate from step (B) at a temperature of 20 to 200° C., in order to convert the at least one precursor compound to at least one semiconductive metal oxide, where, if electrically neutral $[(OH)_x(NH_3)_yZn]_z$ where x, y and z are each independently 0.01 to 10 is used as the precursor compound in step (A), it is obtained by reacting zinc oxide or zinc hydroxide with ammonia, to a substrate which has been coated with at least one semiconductive metal oxide and is obtainable by this process, to the use of this substrate in electronic components, and to a process for preparing electrically neutral $[(OH)_x(NH_3)_yZn]_z$ where x, y and z are each independently 0.01 to 10, by reacting zinc oxide or zinc hydroxide with ammonia.

BACKGROUND OF THE INVENTION

Processes for applying layers of semiconductive materials to substrates are already known from the prior art.

According to WO 2009/010142 A2, printed electronic components can be obtained by using a printable ink which comprises an organometallic zinc complex as a precursor compound for the semiconductive zinc oxide. In the organometallic zinc complex used, at least one oximate ligand is present. In addition, this zinc complex is free of alkali metals and alkaline earth metals. In the process according to WO 2009/010142, preference is given to using an organometallic zinc complex which has a ligand selected from 2-(methoxyimino)alkanoate, 2-(ethoxyimino)alkanoate or 2-(hydroxyimino)alkanoate.

J. J. Schneider et al., Adv. Mater. 20, 2008, 3383-3387, disclose printed and flexible field-effect transistors with nanoscale zinc oxide as the active semiconductive material. These nanoscale zinc oxide layers are applied with the aid of a precursor solution, the precursor compound used being organic zinc complexes with (2-methoxyimino)pyruvate ligands.

EP 1 993 122 A2 discloses a process for producing a semiconductive zinc oxide layer as a thin-layer transistor using a precursor solution which can be processed at low temperatures. The precursor solution comprises a zinc salt and a complexing reagent. Suitable zinc salts are zinc nitrate, zinc chloride, zinc sulfate or zinc acetate. The complexing reagents used are carboxylic acids or organic amines.

S. Meiers et al., J. Am. Chem. Soc., 130(51), 2008, 17603-17609, disclose aqueous inorganic inks for the production of zinc oxide TFTs at low temperature. The precursor compound used for the semiconductive zinc oxide is $Zn(OH)_2(NH_3)_x$. In a two-stage process, this inorganic zinc complex is obtained by reacting high-purity zinc nitrate (99.998%) with sodium hydroxide solution in aqueous solution, followed by the reaction of the zinc hydroxide thus obtained with ammonia. In order to remove the salts formed in the reaction of zinc nitrate with sodium hydroxide solution, numerous removal and washing steps are needed.

The processes described in the prior art for producing semiconductive zinc oxide layers to substrates firstly have the disadvantage that the zinc oxide precursor compounds used are prepared in complex synthesis and purification processes. In addition, some expensive high-purity reactants are used. Furthermore, a disadvantage of the precursor compounds used from the prior art is that the thermal decomposition to obtain zinc oxide affords by-products which remain on the substrate and have to be removed in a further step, or impair the purity and hence the functionality of the zinc oxide layer formed.

DETAILED DESCRIPTION OF THE INVENTION

Figure 1:
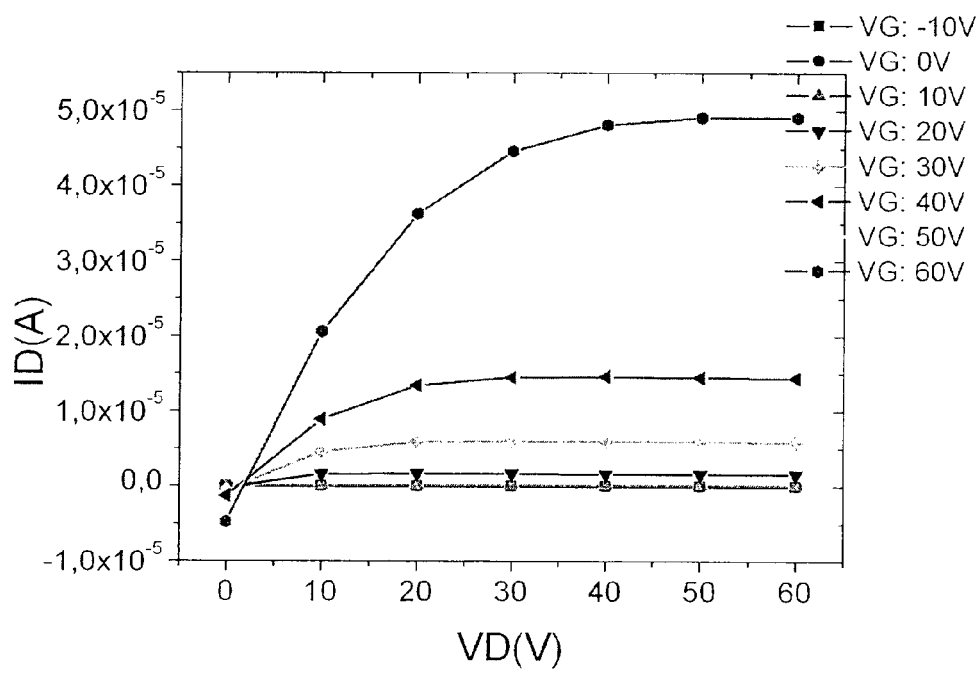
FIGS. 1 and 2 depict representative output curves and transfer curves of a transistor according to the invention.

It is therefore an object of the present invention to provide a process for producing semiconductive layers on substrates, which is notable for a particularly simple process regime. In addition, the coated substrates obtained in accordance with the invention should have a maximum purity of semiconductive material, especially zinc oxide. This shall be achieved in accordance with the invention by using zinc oxide precursor compounds which are converted to the desired zinc oxide by thermal decomposition, without obtaining any troublesome by-products which remain in the layer formed. The semiconductive layers obtained by the process according to the invention should additionally feature improved electronic properties.

These objects are achieved by the process according to the invention for producing a layer comprising at least one semiconductive metal oxide on a substrate, comprising at least the steps of:

(A) preparing a solution comprising at least one precursor compound of the at least one metal oxide selected from the group consisting of carboxylates of mono-, di- or polycarboxylic acids having at least three carbon atoms, or derivatives of mono-, di- or polycarboxylic acids, alkoxides, hydroxides, semicarbazides, carbamates, hydroxamates, isocyanates, amidines, amidrazones, urea derivatives, hydroxylamines, oximes, urethanes, ammonia, amines, phosphines, ammonium compounds, azides of the corresponding metal and mixtures thereof, in at least one solvent, (B) applying the solution from step (A) to the substrate and (C) thermally treating the substrate from step (B) at a temperature of 20 to 200° C., in order to convert the at least one precursor compound to at least one semiconductive metal oxide, where, if electrically neutral $[(OH)_x(NH_3)_yZn]_z$ where x, y and z are each independently 0.01 to 10 is used as the precursor compound in step (A), it is obtained by reacting zinc oxide and/or zinc hydroxide with ammonia.

The process according to the invention serves to produce a layer comprising at least one semiconductive metal oxide on a substrate.

In a particularly preferred embodiment, zinc oxide is used as the semiconductive metal oxide in the process according to the invention. The present invention therefore also relates to the process according to the invention wherein the at least one semiconductive metal oxide is zinc oxide ZnO.

In general, it is possible by the process according to the invention to coat all substrates known to those skilled in the art, for example Si wafer, glass, ceramics, metals, metal oxides, semimetal oxides, plastics such as polyethylene terephthalate (PET), polyethylene naphthalate (PEN), polycarbonates, polyacrylates, polystyrenes, polysulfones, etc.

In a preferred embodiment of the process according to the invention, the substrate is mechanically flexible and comprises at least one plastic, for example selected from the group consisting of polyesters, for example polyethylene terephthalate (PET), polyethylene naphthalate (PEN), polycarbonates, polysulfones and mixtures thereof.

The layer which comprises at least one semiconductive metal oxide and is produced on the substrate by the process according to the invention generally has a thickness of 5 to 250 nm, preferably 5 to 100 nm.

The individual steps of the process according to the invention are described in detail hereinafter:

Step (A):

Step (A) of the process according to the invention comprises (A) the preparation of a solution comprising at least one precursor compound of the at least one metal oxide selected from the group consisting of carboxylates of mono-, di- or polycarboxylic acids having at least three carbon atoms, or derivatives of mono-, di- or polycarboxylic acids, alkoxides, hydroxides, semicarbazides, carbamates, hydroxamates, isocyanates, amidines, amidrazones, urea derivatives, hydroxylamines, oximes, urethanes, ammonia, amines, phosphines, ammonium compounds, azides of the corresponding metal and mixtures thereof, in at least one solvent.

In step (A) of the process according to the invention, a solution of the corresponding precursor compound is prepared. The solvent used may generally be any solvent in which the precursor compounds used are soluble to an extent of at least 0.01% by weight, based on the overall solution.

Suitable solvents are, for example, selected from the group consisting of water, alcohol, for example methanol, ethanol, isopropanol, n-propanol, n-butanol, isobutanol, tert-butanol, ketones, for example acetone, ethers, for example diethyl ether, methyl tert-butyl ether, tetrahydrofuran, dioxane, dimethoxyethane, esters and mixtures thereof. Preference is given to using, in step (A) of the process according to the invention, aqueous, alcoholic or ethereal solutions; particular preference is given to using water as the solvent in step (A).

In step (A) of the process according to the invention, a solution which comprises the at least one precursor compound of the at least one semiconductive metal oxide is prepared in a concentration of 0.01 to 20% by weight, preferably 0.1 to 10% by weight, more preferably 0.5 to 5% by weight, based in each case on the overall solution.

In step (A) of the process according to the invention, at least one precursor compound of the at least one semiconductive metal oxide is dissolved in the appropriate solvent. The at least one precursor compound of the at least one metal oxide is selected from the group consisting of carboxylates of mono-, di- or polycarboxylic acids having at least three carbon atoms, or derivatives of mono-, di- or polycarboxylic acids, alkoxides, hydroxides, semicarbazides, carbamates, hydroxamates, isocyanates, amidines, amidrazones, urea derivatives, hydroxylamines, oximes, urethanes, ammonia, amines, phosphines, ammonium compounds, azides of the corresponding metal and mixtures thereof.

In a preferred embodiment, precursor compounds which decompose at a temperature of generally less than 200° C., preferably less than 150° C., more preferably less than 130° C., most preferably less than 100° C., to the semiconductive metal oxide and volatile products, for example carbon dioxide, ethyl acetate, etc, are used. A minimum temperature for the decomposition of these precursor compounds is, for example, 50° C., or, for example, 20° C. with catalytic activation.

Suitable carboxylates of the corresponding metal are, for example, compounds of the corresponding metal with mono-, di- or polycarboxylic acids with at least three carbon atoms or derivatives of mono-, di- or polycarboxylic acids. According to the invention, derivatives of mono-, di- or polycarboxylic acids are understood to mean the corresponding mono-, di- or polyesters, or anhydrides or amides. According to the invention, the metal atom present as the central atom in the carboxylate complexes may generally have the coordination numbers of 3 to 6.

In the case which is particularly preferred in accordance with the invention, that zinc oxide is applied to the substrate as the semiconductive metal oxide, in step (A), the preferred carboxylates used are corresponding compounds of zinc. In a preferred embodiment, according to the invention, zinc carboxylate complexes with coordination numbers 3 to 6 are used, at least one ligand on the zinc originating from the group of the mono-, di- or polycarboxylic acids having at least three carbon atoms or derivatives of mono-, di- or polycarboxylic acids.

In a further preferred embodiment, the precursor compounds used are zinc carboxylates or derivatives thereof which decompose at a temperature of generally less than 200° C., preferably less than 150° C., more preferably less than 130° C., most preferably less than 100° C., to zinc oxide and volatile products, for example carbon dioxide, acetone, etc. A minimum temperature for the decomposition of these precursor compounds is, for example, 50° C., or, for example, 20° C. with catalytic activation.

Particularly preferred carboxylates used as precursor compounds in step (A) of the process according to the invention correspond to the general formula (I)

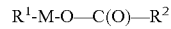

$$R^1\text{-M-O-C(O)-}R^2 \qquad (I),$$

where

M is Zn $R^1$ is hydrogen, linear or branched $C_1$-$C_{12}$-alkyl, linear or branched $C_1$-$C_{12}$-heteroalkyl, substituted or unsubstituted $C_5$-$C_{16}$-aryl, linear or branched, substituted or unsubstituted $C_5$-$C_{16}$-aralkyl, linear or branched, substituted or unsubstituted $C_5$-$C_{16}$-alkaryl, $NR^6R^7$ where $R^6$, $R^7$ are each independently Si—$(C_1$-$C_6$-alkyl$)_3$ or the radical of the formula —O—C(O)—$R^2$ with the definitions of $R^2$ given below, in each case optionally substituted by functional groups with electron donor character, for example hydroxyl, amino, alkylamino, amido, ether and/or oxo, $R^2$ is linear or branched $C_1$-$C_{12}$-alkyl, preferably $C_2$-$C_{12}$-alkyl, linear or branched $C_1$-$C_{12}$-heteroalkyl, preferably $C_2$-$C_{12}$-heteroalkyl, substituted or unsubstituted $C_5$-$C_{16}$-aryl, linear or branched, substituted or unsubstituted $C_5$-$C_{16}$-aralkyl, linear or branched, substituted or unsubstituted $C_5$-$C_{16}$-alkaryl, in each case optionally substituted by functional groups with electron donor character, for example hydroxyl, amino, alkylamino, amido, ether and/or oxo; or radicals of the formula

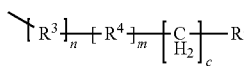 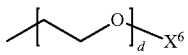

$R^3$ is selected from O and $CH_2$, n, m, c are each independently 0, 1, 2 or 3, preferably 0, 1, 2, and more preferably 0 or 1, $R^4$ is selected from O, C=O, —$X^4$C=CH—, $OCH_2$, $R^5$ is selected from H, OH, $OCH_3$, $OC_2H_5$, $OSi(X^1)_{(3-a-b)}(X^2)_a(X^3)_b$, $CO_2X^5$, $OCO_2X^5$, preferably from $CO_2X^5$, $X^5$ is selected from $C_1$ to $C_4$ alkyl, preferably from methyl, ethyl and tert-butyl, most preferably from ethyl and tert-butyl, a, b are each independently 0, 1, 2 or 3 and the sum of a and b is not more than 3, $X^1$, $X^2$, $X^3$, $X^4$ are each independently selected from H, $C_1$ to $C_{10}$ alkyl, preferably H and $C_1$ to $C_4$ alkyl, more preferably H, methyl and ethyl, d is an integer from 1 to 100, $X^6$ is selected from H, $C_1$ to $C_{10}$ alkyl, preferably from H and $C_1$ to $C_4$ alkyl, more preferably selected from methyl and ethyl.

The compounds of the general formula (I) may be present in solution, preferably in aqueous solution, in the form of agglomerates or polycyclic adducts of two or more molecules of the general formula (I), which are likewise encompassed by the invention.

Ligands present in very particularly preferred carboxylates, especially zinc carboxylates, are selected from the group consisting of monoalkyl 3-oxoglutarates, for example monomethyl 3-oxoglutarate, monoethyl 3-oxoglutarate, monoalkyl malonates, for example monomethyl malonate, monoethyl malonate, and mixtures thereof.

A preferred example of a zinc carboxylate which is used in step (A) of the process according to the invention as a precursor compound is the compound of the formula (II) Zn[(EtOC(O)CH$_2$C(O)CH$_2$COO)$_2$].

In the compounds reproduced as empirical and/or structural formulae in the present invention, solvent molecules, for example water, may possibly be present in the compounds.

Processes for preparing the compound of the formula (II) are known per se to those skilled in the art, for example by reaction of a stoichiometric amount of monoethyl 3-oxoglutarate with diethylzinc in hexane at 0° C.

A further particularly preferred example of a zinc carboxylate which is used in step (A) of the process according to the invention as a precursor compound, and which is present as an adduct of two molecules of the general formula (I), is the compound of the formula (III)

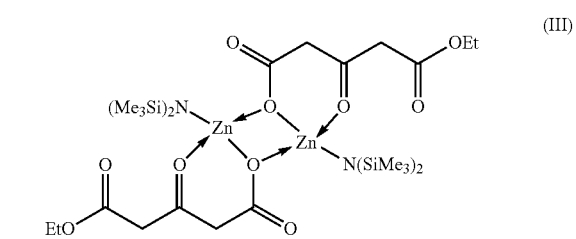

The compound of the formula (III) is likewise preparable by processes known to those skilled in the art, for example by reaction of an equimolar amount of monoethyl 3-oxoglutarate and zinc bis[bis(trimethylsilyl)amide] in benzene or toluene at room temperature.

A further particularly preferred example of a zinc carboxylate which is used in step (A) of the process according to the invention as a precursor compound is the compound of the formula (IV)

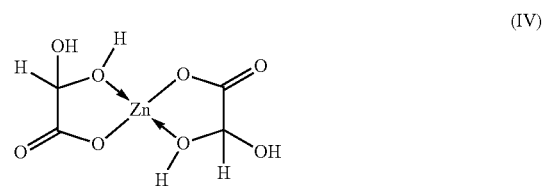

The compound of the formula (IV) is likewise preparable by processes known to those skilled in the art.

A further preferred example of a zinc carboxylate is the compound of the formula (IVa) Zn[(NH$_2$CH$_2$COO)$_2$(H$_2$O)] with electron donor functionality

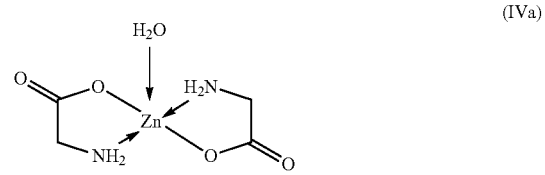

A further particularly preferred example of a zinc carboxylate which is used in step (A) of the process according to the invention as a precursor compound is the compound of the formula (IV b) Zn[{R$^7$R$^8$N—N=C(CH$_3$)CO$_2$}$_2$(H$_2$O)$_2$], likewise with electron donor functionality in the alpha position to the carboxylate group.

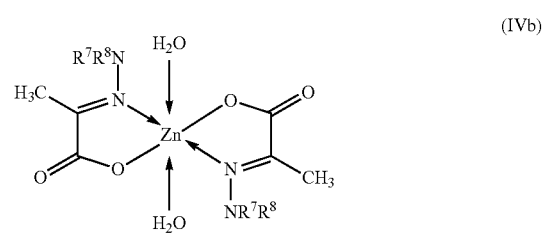

A further preferred example of a zinc carboxylate is the compound of the formula (IVc)

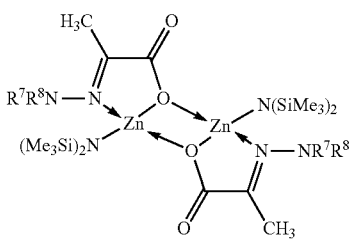
(IVc)

where $R^7=R^8=$methyl, or $R^7=$H and $R^8=$C(O)Me.

Additionally preferably, in step (A) of the process according to the invention, the precursor compound of the at least one metal oxide used is an alkoxide of the corresponding metal.

Preference is given to using metal alkoxides as precursor compounds, in which the metal atom has the coordination number of 3 to 6. In the particularly preferred case that zinc oxide is used as the semiconductive metal oxide, especially zinc alkoxide complexes with coordination numbers of 3 to 6 are used, in which at least one ligand is an alkoxide. These coordination numbers present in accordance with the invention are achieved in the precursor compounds used in accordance with the invention by additions of identical or different molecules to one another.

In a particularly preferred embodiment, the precursor compounds used are zinc alkoxides which decompose at a temperature of generally less than 200° C., preferably less than 150° C., more preferably less than 130° C., most preferably less than 100° C., to the semiconductive metal oxide and volatile products. A minimum temperature for the decomposition of these precursor compounds is, for example, 50° C., or, for example, 20° C. with catalytic activation.

In a particularly preferred embodiment, the metal alkoxides used as precursor compound in step (A) of the process according to the invention correspond to the following general formula (V)

$$(R^9O)_o\text{-}M\text{-}(R^{10})_p \quad (V)$$

where
M is Zn
$R^9$ is linear or branched $C_1$-$C_{12}$-alkyl, linear or branched $C_1$-$C_{12}$-heteroalkyl, substituted or unsubstituted $C_5$-$C_{16}$-aryl, linear or branched, substituted or unsubstituted $C_5$-$C_{16}$-aralkyl, linear or branched, substituted or unsubstituted $C_5$-$C_{16}$-alkaryl, preferably linear or branched $C_1$-$C_6$-alkyl, especially methyl or ethyl, in each case optionally substituted by functional groups with electron donor character, for example hydroxyl, amino, alkylamino, amido, ether and/or oxo,
$R^{10}$ is hydrogen, linear or branched $C_1$-$C_{12}$-alkyl, linear or branched $C_1$-$C_{12}$-heteroalkyl, substituted or unsubstituted $C_5$-$C_{16}$-aryl, linear or branched, substituted or unsubstituted $C_5$-$C_{16}$-aralkyl, linear or branched, substituted or unsubstituted $C_5$-$C_{16}$-alkaryl, $NR^{11}R^{12}$ where $R^{11}$, $R^{12}$ are each independently Si—$(C_1$-$C_6$-alkyl$)_3$, or the radical of the formula —O—C(O)—$R^2$ with the above-specified definitions of $R^2$, in each case optionally substituted by functional groups with electron donor character, for example hydroxyl, amino, alkylamino, amido, ether and/or oxo; $R^9$ is more preferably linear or branched $C_1$-$C_6$-alkyl, especially methyl or ethyl,
o is 1 or 2 and
p is 0 or 1, where the indices are selected such that o+p=2, such that electrically neutral compounds of the general formula (V) are present,
or heterocubanes, for example (Et-Zn—OEt)$_4$ or Zn$_7$O$_8$Me$_{14}$ (formula (Vb)).

Particularly preferred compounds of the general formula (V) are methoxymethylzinc or ethoxyethylzinc.

Further preferred examples of zinc alkoxides which are used as a precursor compound in step (A) of the process according to the invention are the compounds of the formulae (Va), (Vb) and (Vc)

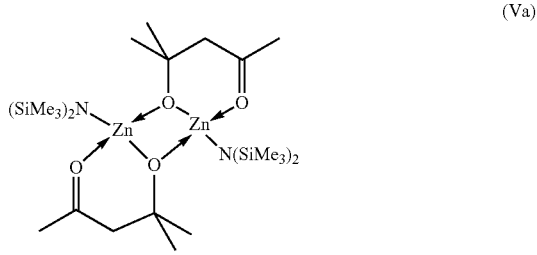
(Va)

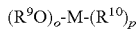

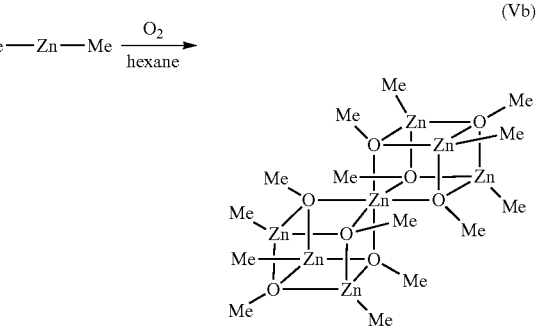
(Vb)

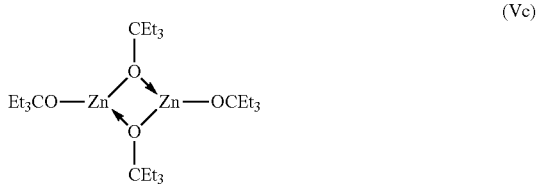
(Vc)

In a further preferred embodiment of the process according to the invention, the at least one precursor compound of the at least one metal oxide used is a hydroxide, semicarbazide, carbamate, hydroxamate, isocyanate, amidine, amidrazone, urea derivative, hydroxylamine, oxime, urethane, ammonia, amine, amide, phosphine, ammonium compound, azide of the corresponding metal or a mixture thereof, more preferably a hydroxo complex of the corresponding metal.

Preference is given to using hydroxo-metal complexes or else aquo complexes as precursor compounds, in which the metal atom has the coordination number of 4 to 6. In the particularly preferred case that zinc oxide is used as the semiconductive metal oxide, especially zinc complexes with coordination numbers of 4 to 6 are used.

In a particularly preferred embodiment, the precursor compounds used are hydroxo-metal complexes which decompose at a temperature of generally less than 200° C., preferably less than 150° C., more preferably less than 130° C., most preferably less than 100° C., to the semiconductive metal oxide and volatile products, for example ammonia.

A minimum temperature for the decomposition of these precursor compounds is, for example, 50° C., or, for example, 20° C. with catalytic activation.

In a particularly preferred embodiment, these compounds correspond to the general formula (VI)

(VI)

where
A, B, C are each independently $R^{13}_3N$ where each $R^{13}$ is independently hydrogen, $C_1$-$C_6$-alkyl, $C_5$-$C_{12}$-aryl, $C_5$-$C_{12}$-aralkyl, $C_5$-$C_{12}$-alkaryl, $N_2R^{13}_4$ where $R^{13}$ is as defined above, $NR^{13}_2OH$ where $R^{13}$ is as defined above, $(NR^{13}_2)_2C=O$ where $R^{13}$ is as defined above, $R^{13}N-CO_2^-$ where $R^{13}$ is as defined above, $N_3^-$, $NCO^-$, acetohydrazides, amidrazones, semicarbazides, $R^{14}_3P$ where each $R^{14}$ is independently hydrogen, methyl or ethyl, $R^{14}_3As$ where $R^{14}$ is as defined above, oximes, urethanes, tetrahydrofuran (THF), diformamide, dimethylformamide (DMF), acetone, water, $C_1$-$C_{12}$-alcohols, ethers having 2 to 12 carbon atoms, for example 1,2-dimethoxyethane (DME), cyclic ethers having 4 to 12 carbon atoms, for example dioxane, especially $NH_3$ and/or OH,
q, r, s, t are each independently 0-10, preferably 0-6, more preferably 0-4, preferably t=2,
u is 1-10, preferably u=1,
where q, r, s, t, u are selected such that electrically neutral compounds of the general formula (VI) are present.

Particular preference is given to using, in step (A) of the process according to the invention, as the at least one precursor compound, the inorganic complex $[(OH)_x(NH_3)_yZn]_z$ where x, y and z are each independently 0.01 to 10, most preferably $[(OH)_x(NH_3)_yZn]_z$ where x=2, y=2 or 4 and z=1, where x, y and z are selected such that the complex mentioned is electrically uncharged, and is obtained by reacting zinc oxide or zinc hydroxide with ammonia, especially by the process according to the invention for preparing electrically neutral $[(OH)_x(NH_3)_yZn]_z$ where x, y and z are each independently 0.01 to 10, x, y and z preferably each independently being integers from 1 to 6, more preferably x=2, y=2 or 4 and z=1.

The present invention therefore especially also relates to the process according to the invention where, in step (A), as the at least one precursor compound of the at least one metal oxide $[(OH)_x(NH_3)_yZn]_z$ where x, y and z are each independently 0.01 to 10, such that the complex mentioned is electrically uncharged, and is obtained by reaction of zinc oxide or zinc hydroxide with ammonia, is used.

Step (A) of the process according to the invention is generally performed at a temperature at which a suitable solution comprising at least one precursor compound of the at least one metal oxide is obtained, for example 5 to 120° C., preferably 10 to 60° C.

Step (A) of the process according to the invention can be performed in all reactors known to those skilled in the art, for example stirred reactors. According to the invention, step (A) can be performed continuously or batchwise.

After step (A) of the process according to the invention, a solution which comprises at least one precursor compound of the at least one metal oxide in a solvent is obtained. In addition to these components, the solution obtained in step (A) may comprise further additives, for example to improve the selected deposition operation onto the substrate (step B).

The solution prepared in step (A) of the process according to the invention may additionally also comprise further metal cations which serve to dope the semiconductive metal oxide. In a particularly preferred embodiment, these metal cations are selected from the group consisting of $Al^{3+}$, $In^{3+}$, $Sn^{4+}$, $Ga^{3+}$ and mixtures thereof. These metal cations can be introduced separately into the solution, or may already be present in the inventive precursor compounds.

The doping metal cations mentioned can be added to the preparation of the solution in step (A) in the form of metal oxides, metal hydroxides, metal alkoxides or in the form of soluble complexes. The dopants mentioned can be added to the solution in step (A) of the process according to the invention generally in an amount of 0.02 to 10 mol % based on Zn, preferably of 0.1 to 5 mol % based on Zn.

The present invention therefore also relates to the process according to the invention wherein the semiconductive metal oxide is doped with metal cations selected from the group consisting of $Al^{3+}$, $In^{3+}$, $Sn^{4+}$, $Ga^{3+}$ and mixtures thereof.
Step (B):

Step (B) of the process according to the invention comprises the application of the solution from step (A) to the substrate.

In general, step (B) can be performed by all methods known to those skilled in the art which are suitable for applying the solution obtained from step (A) to the substrate, for example spin-coating, spray-coating, dip-coating, drop-casting or printing, for example inkjet printing, flexographic printing or gravure printing.

The present invention therefore relates, in a preferred embodiment, to the process according to the invention wherein the solution from step (A) is applied in step (B) by spin-coating, spray-coating, dip-coating, drop-casting and/or printing.

The solution from step (A) is more preferably applied in step (B) of the process according to the invention by spin-coating or inkjet printing. These processes are known per se to those skilled in the art.

The present invention therefore also relates to the process according to the invention wherein the solution from step (A) is applied in step (B) by spin-coating.
Step (C)

Step (C) of the process according to the invention comprises the thermal treatment of the substrate from step (B) at a temperature of 20 to 200° C., in order to convert the at least one precursor compound to the at least one semiconductive metal oxide.

In general, step (C) can be performed in all devices known to those skilled in the art for heating substrates, for example a hotplate, an oven, a drying cabinet, a hot air gun, a belt calciner or a climate-controlled cabinet.

When step (C) of the process according to the invention is performed at a relatively low temperature of, for example, 20 to 50° C., the decomposition to give the at least one semiconductive metal oxide is preferably effected by means of catalytic activation, for example by blowing with a reactive gas or by irradiation. Catalytic activation can also be effected at higher temperatures, but is not preferred.

In step (C), the at least one precursor compound of the semiconductive metal oxide, said precursor compound having been applied to the substrate in step (B) with the solution from step (A), is converted to the corresponding metal oxide, especially zinc oxide.

According to the invention, it is advantageous in this context that the metal oxide precursor compounds used can be converted to the corresponding metal oxide even at a temperature below 200° C., preferably below 150° C., more preferably below 130° C., especially below 100° C., such that, for example, it is possible to use plastics substrates which do not deform and are not thermally degraded during the preparation of the semiconductive metal oxide. A further advantage is that, owing to the precursor compounds used, only volatile by-products form in the course of the thermal treatment in step (C) of the process according to the invention, and thus escape in gaseous form and do not remain in the layer formed as troublesome impurities.

The precursor compounds used in accordance with the invention are generally converted in step (C) to the corresponding metal oxide, especially zinc oxide, and volatile compounds, or mixtures thereof. More particularly, after the thermal treatment in step (C), no by-products of the precursor compounds remain in the metal oxide layer formed, for example counterions such as halide anions, nitrate anions, cations such as $Na^+$, $K^+$, or uncharged ligands. A further advantage of the precursor compounds used in accordance with the invention is that they can generally be converted in step (C) of the process according to the invention to the corresponding metal oxide without addition of further additives, since they already have the oxygen needed for the conversion to the corresponding oxides in the ligand sphere. Since no further additives need be added, no by-products of these additives remain in the layer formed either. It is likewise advantageous that steps (A), (B) and (C) of the preparation process can be performed under ambient conditions (atmospheric oxygen, etc).

The present invention further provides a process for producing a semiconductor component, for example a thin-film transistor TFT, comprising at least the steps (A), (B) and (C), as described above.

The inventive precursor compounds or the metal oxides obtainable therefrom are used as the semiconductor layer of a TFT. The solution of the precursor compound (preparation as described in step (A)) can be processed as described in (B) and (C) to give the semiconductor component of the TFT.

With regard to the TFT architectures, such as bottom gate, top gate, top contact, bottom contact, etc, there are no restrictions. Dielectrics may be all possible organic, inorganic or organic-inorganic hybrid materials. Gate, source and drain contact materials are conductive materials, e.g. Al, Au, Ag, Ti/Au, Cr/Au, ITO, Si, PEDOT/PSS, etc. Suitable substrates are especially also polymeric and flexible materials with a low decomposition temperature, and other thermally labile substrates, without being restricted thereto. Substrate, gate, source and drain contact materials, and also dielectrics, are not subject to any primary restrictions and can be selected according to the chemical/physical compatibility, the processing method and the desired application.

The present invention also relates to a substrate which is coated with at least one semiconductive metal oxide, obtainable by the process according to the invention. The details and preferred embodiments with regard to the substrates, the metal oxides, the precursor compound, etc have already been mentioned above.

Owing to the preparation process according to the invention, especially owing to the use of the specific precursor compounds for the semiconductive metal oxide, especially zinc oxide, the substrates coated in accordance with the invention have outstanding properties with regard to their electronic properties.

For example, a TFT produced by the process according to the invention, preferably a ZnO TFT, has mobilities of $10^{-4}$ to 100 $cm^2/V*s$, preferably $10^{-2}$ to 50 $cm^2/V*s$, more preferably 0.1 to 10 $cm^2/V*s$, for example 0.5 $cm^2/V*s$, and/or an on/off ratio of 100 to $10^9$, preferably $10^3$ to $10^8$, more preferably $10^5$ to $10^8$, for example $10^7$, at a threshold voltage of 0 to 50 V, preferably 0 to 25 V, for example 19V.

The present invention therefore also relates to the use of an inventive substrate in electronic components, for example TFTs, especially the uses thereof in CMOS circuits and other electronic circuits, RFID tags, displays, etc. The present invention therefore relates to the use of the inventive substrate in electronic components, wherein the electronic component is a TFT, RFID tag or a display.

The processability from solution at plastic-compatible temperatures makes it possible to produce components on flexible, bendable substrates.

The present invention also relates to a process for preparing electrically neutral $[(OH)_x(NH_3)_yZn]_z$ where x, y and z are each independently 0.01 to 10, preferably integers from 1 to 6, by reacting zinc oxide and/or zinc hydroxide with ammonia.

In a particularly preferred embodiment, x=2 and y=2 or y=4 and z=1, such that particular preference is given in accordance with the invention to preparing $[(OH)_2(NH_3)_2Zn]$ or $[(OH)_2(NH_3)_4Zn]$.

The electrically neutral $[(OH)_x(NH_3)_yZn]_z$ where x, y and z are each independently 0.01 to 10 prepared by the process according to the invention is notable in that it does not comprise any impurities, for example extraneous ions such as $Na^+$, $K^+$, $NO_3^-$ etc, which originate from the reactants used for the preparation, exceptionally inexpensive reactants can be used and no purification steps are needed. The product obtained preferably has, directly after the preparation without further purification steps, a particularly high purity, for example of >99%, preferably of >99.5%, more preferably of >99.9%. According to the invention, this particularly pure starting compound can be used to obtain semiconductive zinc oxide layers which likewise have a particularly high purity. This high purity has a positive effect, for example, on the semiconductive properties of the layers.

In this process, in a first step, solid zinc oxide or zinc hydroxide or mixtures thereof are preferably initially charged in a suitable reactor. This solid zinc oxide and/or zinc hydroxide is or are then preferably treated with a solution of ammonia ($NH_3$) in a suitable solvent.

The solvent is preferably an aqueous solvent, for example an alcoholic aqueous solution or water, more preferably water. Ammonia is present in this preferably aqueous solution in a concentration of 1 to 18 mol %, preferably 2 to 15 mol %, more preferably 3 to 12 mol %, based in each case on the overall solution. A sufficient amount of the ammonia solution is added to the solid zinc oxide that a reaction mixture is obtained, in which zinc oxide is generally present with a concentration of 0.01 to 2 mol/l, preferably 0.1 to 1 mol/l, more preferably 0.1 to 0.5 mol/l. Optionally, it is also possible to work directly in liquid ammonia.

The reaction mixture thus obtained is then stirred at a temperature of generally 10 to 120° C., preferably 10 to 60° C., more preferably 20 to 30° C. In general, the suspension is stirred until complete conversion is obtained, for example 2 to 72 h, preferably 2 to 24 h. After complete reaction, a solution of the desired product in the solvent, especially water, is present. To remove any suspended solids present, the resulting solution can optionally be purified, for example by filtration. The desired product is thus obtained in particularly high purity in preferably aqueous solution.

The process is notable in that the desired compound is obtained in only one step, without purifying the product, from particularly inexpensive reactants, in a particularly high purity. The electrically neutral $[(OH)_x(NH_3)_yZn]_z$ thus obtained, where x, y and z are each independently 0.01 to 10, is therefore especially preferably used in the process according to the invention to produce a layer comprising at least one semiconductive metal oxide on a substrate.

EXAMPLES

Example 1

Preparation of $Zn(OH)_2(NH_3)_4$

A 500 ml four-neck flask is initially charged with 6.10 g of ZnO (pharmaceutical quality, Umicore). 500 ml of a 6.6 mol/l $NH_3/H_2O$ solution are added thereto. The suspension is stirred at 300 rpm at room temperature overnight. This affords a clear solution with a low level of suspended solids which are removed by means of a glass frit, so as to obtain a clear solution of the complex specified. Elemental analysis of the solution gives a Zn content of 1.0 g/100 g of solution.

Example 2

Production of a TFT with ZnO as the Semiconductor Material

Figure 2:
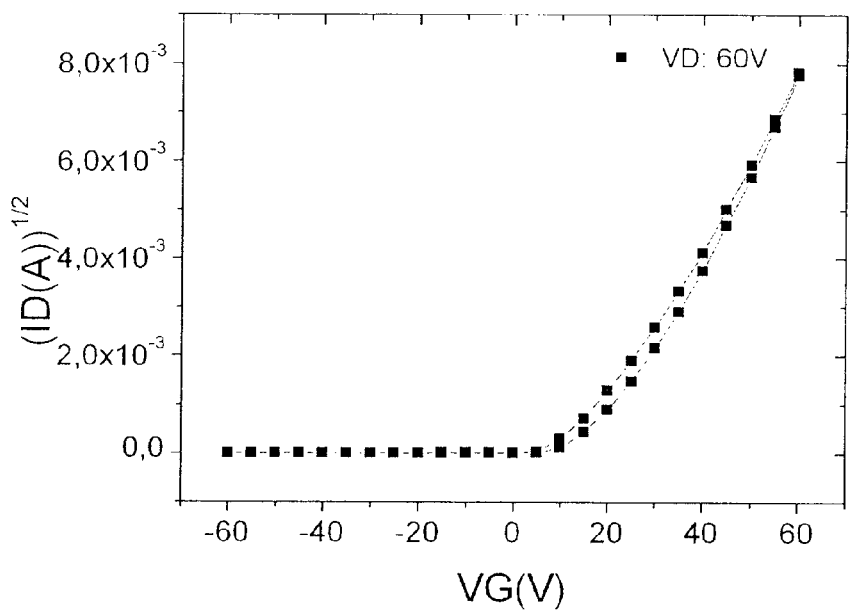

A cleaned $Si_{doped}$ substrate with an $SiO_2$ dielectric layer (200 nm) is flooded with the aqueous solution from example 1 which is applied by spin-coating at 3000 revolutions/min for 30 s. Subsequently, the sample is heated at 150° C. for 20 min. Source/drain contacts (channel width/length ratio: 20) are obtained by thermal vapor deposition of aluminum. Representative output curves (OC) and transfer curves (TC) of a corresponding transistor are depicted in FIGS. 1 and 2. In these figures, VD: voltage between source and drain, VG: voltage between source and gate, ID: current between source and drain.

The following average parameters are determined:
Mobility μ: 0.5 $cm^2/(V*s)$
On/off ratio: $10^7$
$V_T$ threshold voltage 19 V.

The invention claimed is:

1. A process for producing a layer comprising zinc oxide on a substrate, the process comprising:
   (A) applying a solution comprising
      an electrically neutral $[(OH)_x(NH_3)_yZn]_z$ wherein x, y, and z are each independently 0.01 to 10, obtained by reacting at least one of solid zinc oxide and zinc hydroxide with ammonia,
      in at least one solvent,
      to a substrate; and
   (B) thermally treating the substrate from (A) at a temperature of 20 to 200° C., thereby converting the electrically neutral $[(OH)_x(NH_3)_yZn]_z$ to zinc oxide.

2. The process of claim 1, wherein the substrate is mechanically flexible and comprises at least one plastic.

3. The process of claim 1, wherein the zinc oxide is doped with at least one metal cation selected from the group consisting of $Al^{3+}$, $In^{3+}$, $Sn^{4+}$, and $Ga^{3+}$.

4. The process of claim 1, wherein the solution from (A) is applied by at least one operation selected from the group consisting of spin-coating, spray-coating, dip-coating, drop-casting, and printing.

5. A substrate, comprising a coating comprising zinc oxide and obtained by the process of claim 1.

6. An electronic component, comprising the substrate of claim 5.

7. The component of claim 6, which is a TFT, RFID tag, or a display.

8. The process of claim 1, further comprising:
   processing to produce a semiconductor component.

9. The process of claim 1, wherein the electrically neutral $[(OH)_x(NH_3)_yZn]_z$ is obtained by reacting solid zinc oxide with ammonia.

10. The process of claim 1, wherein the electrically neutral $[(OH)_x(NH_3)_yZn]_z$ is obtained by reacting solid zinc hydroxide with ammonia.

11. The process of claim 1, wherein x is 2, y is 2 or 4, and z is 1.

12. The process of claim 1, wherein the electrically neutral $[(OH)_x(NH_3)_yZn]_z$ has a purity of 99% or more directly after reacting the solid zinc oxide or the zinc hydroxide with the ammonia, without a further purification.

13. The process of claim 12, wherein the purity is 99.5% or more.

14. The process of claim 12, wherein the purity is 99.9% or more.

15. The process of claim 1, wherein the electrically neutral $[(OH)_x(NH_3)_yZn]_z$, comprises substantially no $Na^+$, $K^+$ or $NO_3^-$ ions.

16. The process of claim 1, wherein the thermal treating (B) is performed at a temperature of 20 to 50° C.

* * * * *